United States Patent [19]

Sanders

[11] 3,795,870

[45] Mar. 5, 1974

[54] ADAPTIVE BANDWIDTH PHASE LOCK LOOP EMPLOYING HIGH SPEED LOOP LOCK AND FAST PHASE TRANSIENT REDUCTION

[75] Inventor: Steven Neil Sanders, Los Altos, Calif.

[73] Assignee: Hewlett-Packard Company, Palo Alto, Calif.

[22] Filed: Oct. 30, 1972

[21] Appl. No.: 302,063

[52] U.S. Cl. .................... 331/1 A, 331/11, 331/17, 331/27, 331/36 C, 331/117 R, 331/177 V

[51] Int. Cl. .................... H03b 3/04

[58] Field of Search .......... 331/1 A, 11, 17, 25, 27

[56] References Cited

UNITED STATES PATENTS

| | | | |
|---|---|---|---|
| 3,441,871 | 4/1969 | Wicker | 331/11 |
| 3,611,175 | 10/1971 | Boelke | 331/11 X |

*Primary Examiner*—Herman Karl Saalbach
*Assistant Examiner*—Siegfried H. Grimm
*Attorney, Agent, or Firm*—Patrick J. Barrett

[57] ABSTRACT

A phase lock loop system employing a frequency-phase detector circuit operating in the frequency detector mode to produce a high level dc control signal to the VCO of the loop to slew the VCO rapidly to lock the loop, the bandwidth of the loop being relatively wide before the loop reaches steady-state lock thereby to reduce the phase transient to the steady-state lock at a rapid rate, the loop bandwidth at steady-state being lower in value and at an optimum value for good noise characteristics. At loop lock, the frequency/phase detector circuit switches to its phase detector mode of operation for normal phase lock loop operation. Speed up of loop lock is accomplished by the enabling of a variable high gain amplifier during off lock to substantially increase the output level of the phase detector to the VCO tuning circuitry.

7 Claims, 15 Drawing Figures

PATENTED MAR 5 1974 3,795,870

SHEET 02 OF 10

PATENTED MAR 5 1974

3,795,870

ADAPTIVE BANDWIDTH PHASE LOCK LOOP EMPLOYING HIGH SPEED LOOP LOCK AND FAST PHASE TRANSIENT REDUCTION

BACKGROUND OF THE INVENTION

In phase lock loop systems it is a desired objective to obtain a microwave or high RF signal which is as clean from noise, particularly phase noise, as possible. A typical spectrum of the RF output signal from an unlocked phase lock loop circuit is shown by curve A in FIG. 1. A typical "multiplier up" spectrum of a reference crystal oscillator to which the phase lock loop will lock onto is shown by curve B. For example, the RF signal may be at 200 MHz while the crystal oscillator is operating at 10 MHz and when it is multiplied up to 200 MHz its phase noise is also multiplied by 20. A phase lock loop, within the bandwidth of the loop, follows the incoming signal that it is locked to, i.e., the loop forces the output signal of an RF oscillator, e.g., a voltage tuned oscillator to the same frequency as the incoming signal, to which the loop locks. If the phase lock loop is given a wide bandwidth, the output spectrum will follow curve B out along section B'. If the phase lock loop is given a narrower bandwidth, the RF oscillator output will follow the multiplied up phase noise of the input signal crystal oscillator to the point where curve B intersects with curve A, and thereafter the RF oscillator noise will follow the phase noise of curve A. Therefore, the optimum place to establish the bandwidth of the phase lock loop to produce the cleanest RF output signal is at the crossover point C of the multiplied crystal oscillator spectrum with the spectrum of the unlocked RF oscillator. If the bandwidth, *f*, is adjusted to this point, then the RF oscillator follows the minimum phase noise of the crystal oscillator to the crossover point C and thereafter follows the lower phase noise of the RF oscillator beyond the loop bandwidth.

Thus, the optimum bandwidth of the phase lock loop is a function of the two oscillators and, if the noise of one (or the other) of the oscillators can be improved, then the bandwidth of the phase lock loop can be increased (or decreased) with a resultant improvement in the noise performance. For example, if the crystal oscillator phase noise performance can be improved, i.e., the spectrum of curve B lowered so that the crossover point C between curve B and curve A occurs further out from the center, then the bandwidth of the phase lock loop can be increased for optimum noise performance.

In these phase lock loops, designing for an optimum bandwidth results in other characteristics which are less than optimum. For example, an optimum bandwidth loop may not give an optimum speed or lockup time for the loop. The time taken to lock the loop is dependent on the bandwidth; the wider the bandwidth, the faster the lockup time and vice versa. However, the optimum bandwidth for noise performance may result in a slow lockup time. For example, assuming that the lockup time for a given phase lock loop for optimum bandwidth is 100 milliseconds, to improve the lockup time to 50 milliseconds it is necessary to increase the bandwidth of the phase lock loop and the noise performance deteriorates. Thus there is a tradeoff between speed in lockup time and phase noise for the phase lock loop.

In prior art circuits utilizing digital-to-analog converters and shaping circuits for coarse tuning the RF oscillator, it is possible to improve the lockup time while maintaining good noise performance by providing a very stable RF oscillator, and very stable shaping networks and digital-to-analog converters. For example, by making such circuitry twice as stable and by increasing the number of bits in the digital-to-analog converter, by for example two bits added to a 14-bit digital-to-analog converter, the lockup time of a phase lock loop can be increased from 100 milliseconds to 50 milliseconds. To accomplish this, the circuitry becomes on the order of two to four times as expensive. In addition to the expense, the circuitry becomes extremely complex; for example, the shaping circuit alone may require 10 adjustments and the time lost in performing the 10 circuit adjustments is mot undesirable. However, as the coarse tuning error of the RF oscillator frequency decreases as a result of this more expensive and complex circuitry, the lockup time will decrease, but not by a significant amount.

Also, any changes in the power supply used to operate the instrument of which the phase lock loop is a part will result in a change in the operating characteristics of the RF oscillator. Thus, if the RF oscillator is made more stable, it is also necessary that the power supply be more stable and thus more expensive. An alternative is to have the RF oscillator less susceptible to power supply changes, but this also increases cost. This also results in the circuits being less reliable. Also, loss of one diode in the shaping circuit or loss of one bit in the digital-to-analog converter results in an inoperative phase lock loop.

SUMMARY OF THE PRESENT INVENTION

The present invention provides a novel adaptive bandwidth form of phase lock loop circuit which provides a very high speed of loop lock up while maintaining optimum loop bandwidth during the steady state lock-up operation. This phase lock loop circuit employs a frequency/phase detector circuit which operates in the frequency detector mode when the loop is unlocked to control a speed up circuit to slew the RF oscillator to the lock condition in a time orders of magnitude faster than with standard forms of phase detectors. The frequency phase detector thereafter functions in the phase detector mode to maintain the loop in the steady-state lock condition. When the speed up circuit brings the loop to the locked condition, the bandwidth of the phase lock loop is at a high value to provide a fast loop transient settling time. At the time the locked loop settles into its steady state condition, the loop bandwidth is lowered to the optimum value for good noise performance.

The phase lock loop circuitry of this invention employs a pair of frequency divider circuits, a divide by *M* circuit ($\div M$) and a divide by *N* circuit ($\div N$) for supplying the input to the frequency/phase detector circuit. These divider circuits are each programable over a range of integral values by any suitable programming means, such as presently used in wide frequency band spectrum analyzer systems. The dividers, $\div M$ and $\div N$, may be intentionally fixed at a number greater than or equal to four.

The output of the frequency/phase detector, when in the frequency detector mode of operation, enables a variable gain amplifier to amplify the dc output of the phase detector and force the tuning circuitry of the RF oscillator in the loop to rapidly tune the RF oscillator to the lock condition with the input frequency. The variable gain amplifier in the speed up circuit is thereafter diabled and the phase detector output is supplied to the RF oscillator via the steady state RF oscillator tuning input.

DESCRIPTION OF THE PREFERRED EMBODIMENTS

Figure 1:
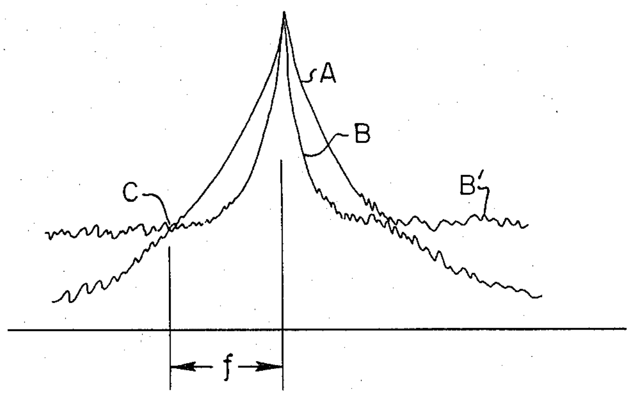
FIG. 1 is an illustration of the spectrum of an RF phase lock loop when unlocked and the spectrum of a reference crystal oscillator.
Figure 2:
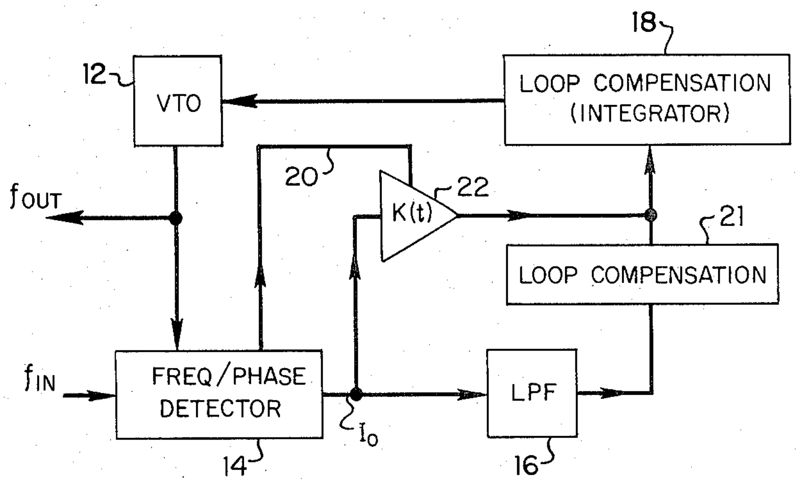
FIG. 2 is a simplified block diagram of the novel phase lock loop of the present invention utilizing VTO speed up.

Referring now to FIG. 2 there is shown a block diagram of the novel phase lock loop circuit of the present invention utilizing an adaptive bandwidth technique. As with typical prior art phase lock loops, this system includes a voltage tunable oscillator (VTO) 12, a phase detector 14 receiving a signal from the voltage tunable oscillator 12 and an input frequency $f_{IN}$, a lowpass filter 16 at the output of the phase detector 14, and certain fairly simple electrical circuits 18 and 21 utilized as loop compensation feeding the output control signal from the phase detector 14 back to produce the input tuning input to the VTO 12 from a storage element or integrator 18 in the loop compensation circuitry. Prior art phase lock loops lump the loop compensation elements 18 and 21 together. Such a circuit will operate to lock the loop with $f_{OUT}$ equal to a rational fraction of $f_{IN}$, but the time for lock will be relatively long. In the present invention the output from the VTO 12 and the $f_{IN}$ signal are fed to a phase detector of the digital frequency/phase detector type and the output of this frequency/phase detector 14 is coupled through a variable gain amplifier 22 to the input to the integrator stage 18 of the loop compensation circuitry. With the loop out-of-lock, the digital frequency/phase detector 14 operates as a frequency detector and enables the variable gain amplifier 22 via line 20 such that the output from the frequency/phase detector as amplified by variable gain amplifier 22 is a very large amplitude control signal to slew the VTO very rapidly to a lock condition. At lock, the enable line 20 to the variable gain amplifier 22 is turned off, the frequency/phase detector operates in the phase detector mode, and the phase lock loop operates with a high bandwidth, controlled by the variable gain amplifier 22. The loop bandwidth gradually reduces as the gain of the variable gain amplifier 22, K(t), reduces toward zero. When $K(t) = 0$, the steady-state phase locking path via LPF, 16, maintains lock.

Therefore, the frequency/phase detector 14 receives pulses from $f_{IN}$ representing the frequency of the input signal and pulses from the VTO 12 representing its operating frequency, the number of pulses being received from both inputs being stored and utilized to determine if the two frequencies are the proper rational fraction of each other. If their ratio does not form the proper rational fraction, then the enable line 20 turns on the variable gain amplifier 22 to increase very substantially the control voltage applied to the VTO for rapid slewing of the VTO to lock, e.g., 250 times faster than with a normal phase detector control. Once lock is reached, the bandwidth of the phase lock loop is at its maximum value and is progressively decreased such that the phase transients of the loop die down rapidly. At steady state, the bandwidth has been decreased to the optimum value for good noise performance.

Figure 3:
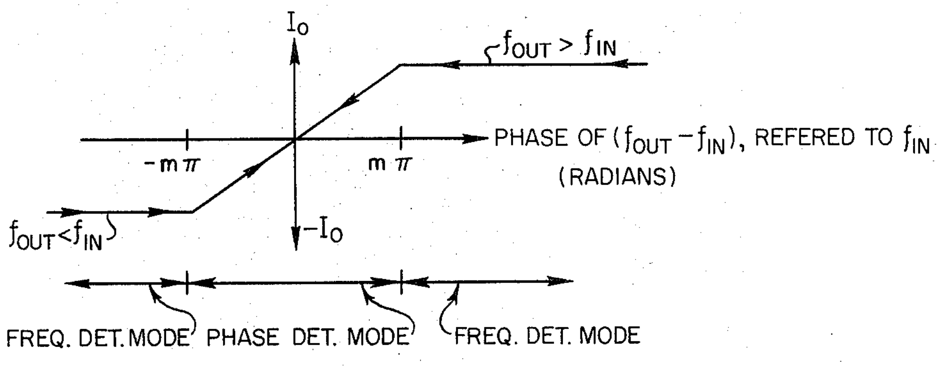
FIG. 3 is an illustration of the transfer function of a frequency/phase detector circuit of the type utilized in the system of FIG. 2.

The transfer function of the frequency/phase detector 14 of FIG. 2 is shown in FIG. 3 in which the abscissa is the phase of $(f_{OUT} - f_{IN})$ in radians and the ordinate is the current $I_0$ out of the frequency/phase detector. The frequency/phase detector 14 operates in the phase detector mode between the two phases — $m\pi$ and + $m\pi$, where $m$ is, for example, > 4 and operates as a saturated, non-linear frequency detector beyond these phases, producing a maximum current output $I_0$ which is positive when $f_{OUT} > f_{IN}$ and a maximum negative current $I_0$ when $f_{OUT} < f_{IN}$. When frequency/phase detector 14 is operating as a frequency detector, the variable gain amplifier 22 operates at maximum gain and delivers a maximum current output to the integrator in the loop compensation stage 18. The maximum positive current $I_0$ out from the frequency/phase detector forces the VTO 12 frequency to decrease whereas the maximum negative current $I_0$ out forces the operating frequency of the VTO 12 to increase. When operating in the phase detector mode, the gain of the variable gain amplifier 22 decreases from maximum to zero at steady state.

The value $m$ is an integral number which depends upon the particular circuitry, and may be programmed. It is equal to or greater than 4 for proper operation but it can be greater, for example, 11; the higher the number, the better the resolution.

Figure 4:
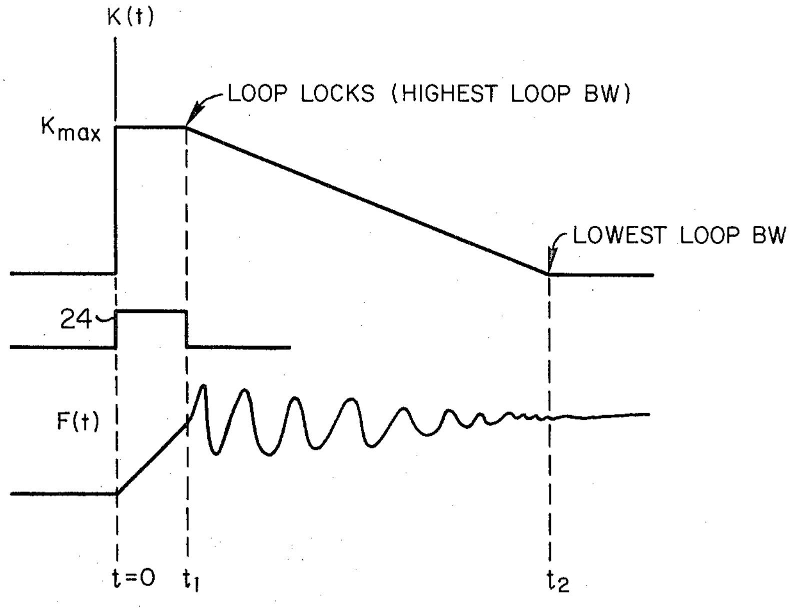
FIG. 4 shows traces illustrating the operation of the variable gain amplifier circuitry utilized in the speed up section of the phase lock loop.

The operation of the variable gain amplifier 22 is illustrated in FIG. 4 where time is the abscissa and the gain, $K(t)$, of the variable gain amplifier is the ordinate. At $t=0$ the loop unlocks and the gain, $K(t)$, of variable gain amplifier 22 is $K_{MAX}$. The frequency/phase detector 14 operates to enable variable gain amplifier 22 as illustrated by the enable signal trace 24. With a $K_{MAX}$ of 250, the integrator, an energy storage device, will be charged 250 times faster with this novel slewing circuit than if variable gain amplifier 22 were not utilized with the phase lock loop. Once the frequency/phase detector 14 determines that the VTO 12 has been slewed far enough to lock, the enable signal 24, $V_{ENABLE}$, is removed from the variable gain amplifier, i.e., the voltage on enable line 20 goes to zero at time $t_1$. The time between $t=0$ and $t_1$ is variable and is determined by how far the VTO 12 is from the input frequency $f_{IN}$. This time is 100 microseconds, worst case maximum.

After the phase lock loop reaches lock at $t_1$, there is a phase transient $\phi(t)$ that occurs which dies out exponentially with time. The frequency is not at its steady state value until $\phi(t)$ is constant since $F = d\phi(t)/dt$ where $F$ is the frequency deviation from steady state frequency. At the instant that lock occurs, $t_1$, (within $m\pi$ radians of the steady-state phase), the bandwidth of the phase lock loop is much higher than the steady-state bandwidth, and the loop transient settling time of the circuit is substantially reduced. As the gain of the variable gain amplifier, $K(t)$, decreases from $K_{MAX}$ to zero at the time $t_2$, the phase lock loop reaches the lowest loop bandwidth at the steady-state condition, which is the optimum bandwidth for noise performance. The difference between times $t_2$ and $t_1$ is 500 microseconds.

There are types of phase detectors that can be used in phase lock loops other than the frequency/phase detector and speed-up loop including mixers and samplers. Mixer and sampler types of detectors take a much longer time to lock because, while the loop is trying to lock, the phase detector puts out only a very small amount of DC voltage to pull the loop in the proper direction to lock. Also, the mixer type of phase detector loop has a very limited capture range where capture range is the frequency difference between the frequency at which the VTO is operating and the furthest input frequency $f_{IN}$ that will cause the oscillator to shift to lock.

The hold-in range for a phase lock loop is defined as that frequency range over which $f_{IN}$ can move and have the VTO frequency follow $f_{IN}$. In a mixer and sampler type phase detector, the hold-in range is much greater than the capture range. In the frequency/phase detector, the capture range is increased to the hold-in range since the frequency/phase detector puts out a relatively large dc output that can tune the VTO over a very large capture range. Thus this large DC component output, when the loop is not locked, is an important feature of the frequency/phase detector.

Figure 5:
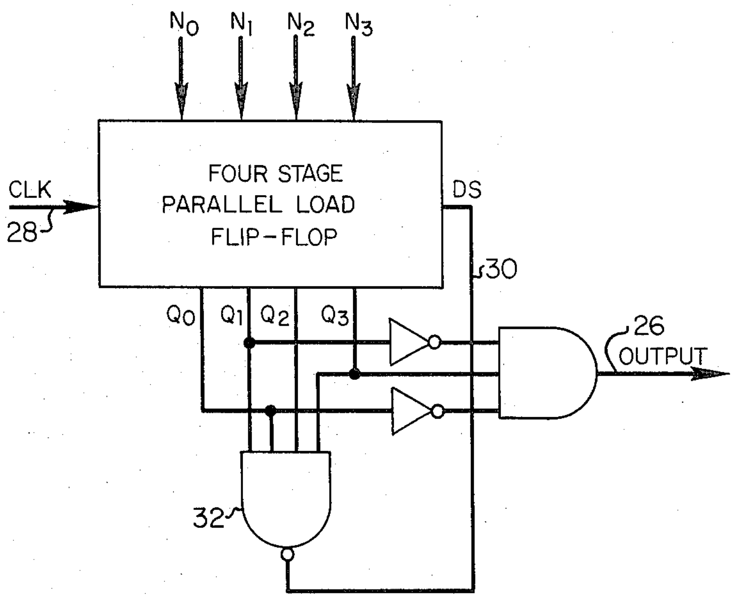
FIG. 5 is a simple block diagram of the operation of a divide by N circuit of the type utilized in the present invention.

The frequency/phase detector of the present embodiment utilizes a pair of "divide by" (÷) counters, a ÷ $N$ counter where $N$ is an integer from 11 to 21, inclusive, and a ÷ $M$ counter where $M$ is an integer from 8 to 27, inclusive These ÷ $N$ and ÷ $M$ counters may be standard type integrated such as the Fairchild 9316 or 9310. The general form of such a ÷ $N$ counter is shown in simplified block diagram form in FIG. 5. Depending on the particular $N$ number programmed in bit form on the four $N$ leads $N_0$, $N_1$, $N_2$ and $N_3$, there is one pulse produced on the output 26 of this ÷ $N$ counter for every $N$ clock pulses received on the input 28. For example, since the circuit illustrated divides by the complement of its input (i.e., 16-N), with $N$ set at 6, there is one pulse output for every 10 clock pulses input to the circuit. The counter divides by the complement of the number $N$. The data on the $N$ lines is parallel loaded into the four-stage parallel load flip-flops in the counter. When the data strobe line 30 from NAND gate 32 goes low, the parallel bits of $N$ data are loaded into the counter and $Q_0$ becomes $N_0$, $Q_1$ becomes $N_1$, etc. When the data strobe line 30 goes high, then the clock increments the counter one each time, and gate 32 senses state 15, or 1111, and the strobe line 30 becomes low on that state and parallel loads that number. The counter will count up to 15 and then it will reset itself; it takes one count to reset itself and so it will be counting a total of 16. By selective programming on the $N_0$ through $N_3$ lines or by selected ANDing of the $Q_0$ – $Q_3$ lines to gate 32, the divide by $N$ counter may be arranged to provide selected values of $N$.

Figure 6:
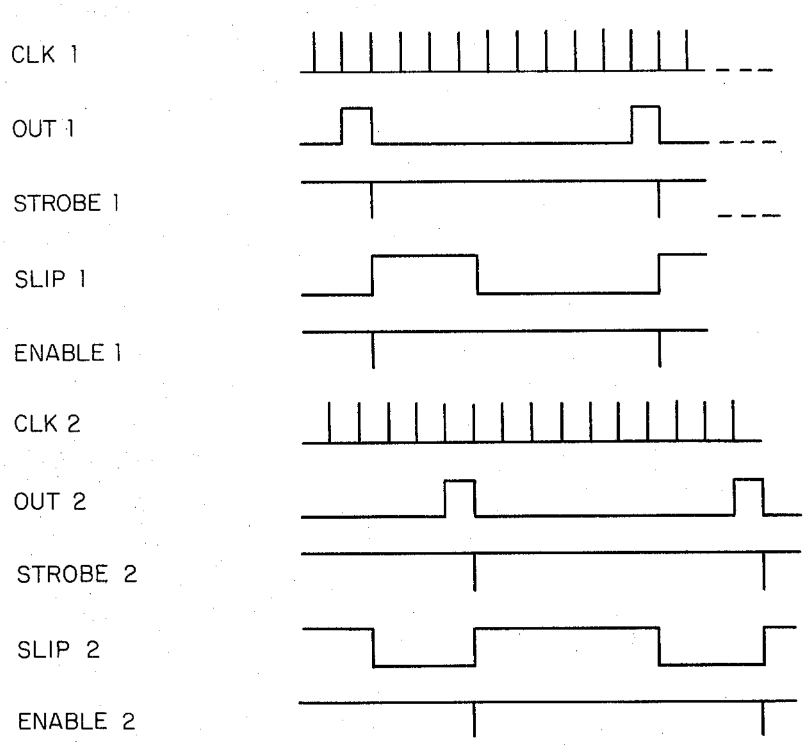
FIG. 6 shows pulse traces illustrating the operation of the circuit of FIG. 5.

With reference to traces CLK 1, OUT 1, and STROBE 1 of FIG. 6, the output pulse is high only for the interval between two successive clock pulses, i.e., the width between two clock pulses. In the case where the ÷ $N$ counter is a ÷ 15 counter, the OUT 1 would be high for one interval and low for 14 intervals and then high for one and low for the next 14. The falling edges of the clock pulse determine the rising and falling edge of the output pulse. The falling edge of the clock pulse also determines the falling edge of the data strobe pulse because the falling edge of the data strobe is determined when the output of gate 32 falls. The width of the data strobe pulse is determined by how fast the flip-flops of the counter can be parallel loaded and ripple back through the NAND gate 32.

Figure 7:
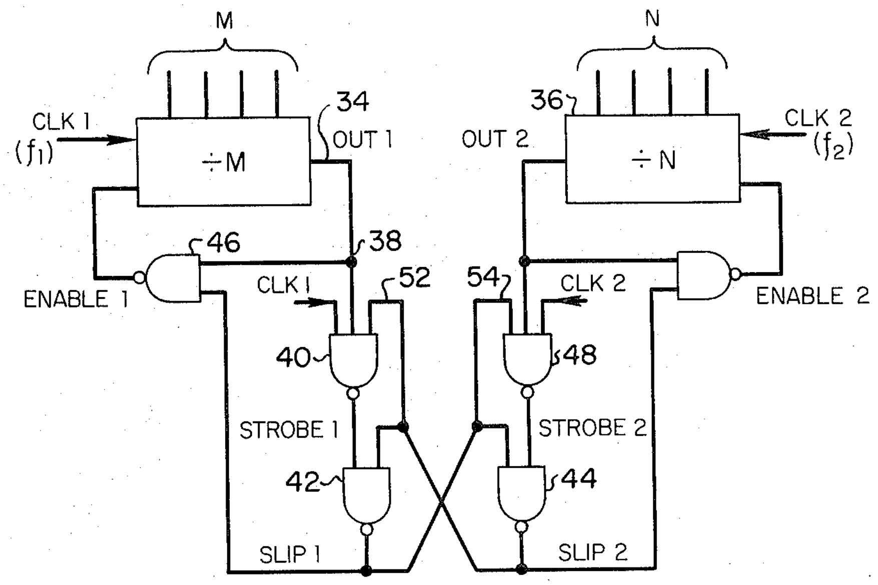
FIG. 7 is a simple block diagram illustrating the operation of a pair of divide by counters utilized in producing the phase detector output of the present invention.

Referring now to FIG. 7 there is shown a block diagram of a form of divide by $M$ and divide by $N$ counter circuits utilized in the preferred embodiment of the present invention. There are three different stages of operation; i.e., (1) when OUT 1, $(f_1)/M$, equals OUT 2, $(f_2)/N$;(2) where $f_1/M$ is greater than $f_2/N$, and (3) where $f_1/M$ is less than $f_2/N$, Where $f_1/M$ equals $f_2/N$, the output frequencies OUT 1 and OUT 2 are equal and the clock inputs CLK 1 and CLK 2 continuously run the two counters 34 and 36. In this situation the two counters are never disabled and they count continuously. The pulses at OUT 1 at frequency $f_1/M$ and the pulses at OUT 2 at frequency $f_2/N$ are equal in frequency and interleaved in time as shown in FIG. 6. If the enable 1 and enable 2 signals are always high, then the output frequencies OUT 1 and OUT 2 are always the same and the divide by $N$ and divide by $M$ counters are continuously enabled by these signals. In this situation the pulses OUT 1 and OUT 2 are interleaved and not overlapping each other. The rising edge of OUT 1 is caused by the falling edge of the CLK 1 pulse and the falling edge of OUT 1 is caused by the falling edge of the next CLK 1 pulse. So the OUT 1 line 38 is high for the duration of the interval between two successive CLK 1 pulses. Therefore, both inputs of gate 40 are high for the length of a CLK 1 pulse. This produces a very narrow negative going STROBE 1 pulse on the output of gate 40, causing the simple latch circuit made up of NAND gates 42 and 44 to produce a high on the SLIP 1 output and low on the SLIP 2 output. For a very short period of time there is a high from OUT 1 on one input to NAND gate 46 as the SLIP 1 goes high so there is a very short negative going ENABLE 1 pulse on the enable input to the divide by M counter 34. However, the counter 34 is not disabled since the pulse is of extremely short duration and falls in between successive CLK 1 pulses. This negative going ENABLE 1 pulse would disable ÷ $M$ if it occured concurrently with CLK 1.

Now, at some time after the OUT 1 pulse, the divide by N counter 36, which has been counting the pulses on the CLK 2 input, produces a pulse on the OUT 2 lead to gate 48, resulting in a negative going STROBE 2 pulse which serves to operate the latch 42, 44 to make the SLIP 2 lead go high and the SLIP 1 lead go low. As before, a very short negative going ENABLE 2 pulse is produced but it does not serve to disable the counter 36. Thus, as both counters continue to count, they produce an equal number of OUT 1 and OUT 2 pulses, these two pulses being interleaved and not overlapping, resulting in alternating and complementary SLIP 1 and SLIP 2 outputs.

This is the locked state and it is noted that the pulse between the OUT 1 pulses and the OUT 2 pulses (and consequently the phase between $f_1$and $f_2$) determines the duty cycle of the SLIP 1 output. The duty cycle of SLIP 1 can vary between at least 10 percent and 90 percent and preferably the duty cycle is close to 50 percent. In this preferred embodiment, an integrator is placed in the loop to force the SLIP 1, SLIP 2 duty cycle to about 50 percent. The output of the SLIP 1 signal is run through a lowpass filter and integrated, and the duty cycle of SLIP 1 determines the DC level of the integrated signal output produced by SLIP 1; a longer duty cycle will produce a higher DC level at the integrated output than a short SLIP 1. Thus there is a linear relationship between the DC current output and the duty cycle of the SLIP 1, and this DC output is used as the VTO control during the loop lock operation.

Figure 8:
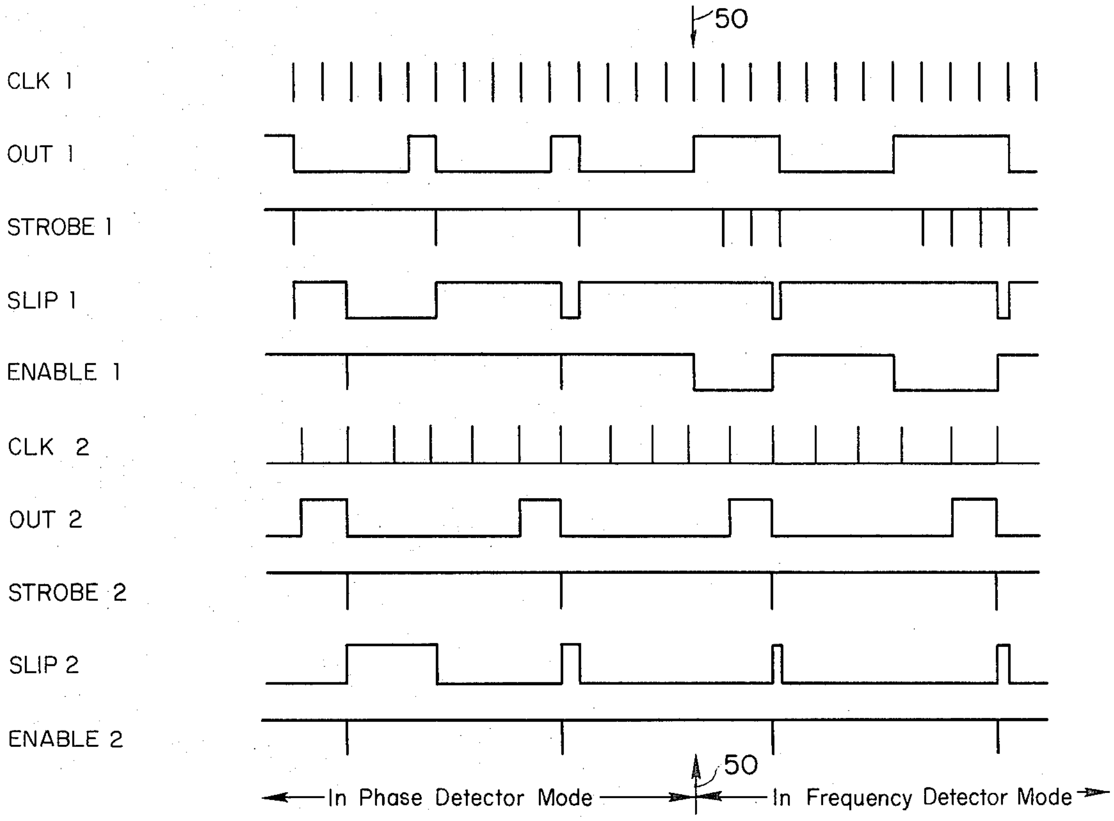
FIG. 8 shows pulse traces illustrating the operation of the frequency/phase detector circuitry of FIG. 7 as the detector switches from the phase detector mode to the frequency detector mode.

In the second case, where $f_1/M$ is greater than $f_2/N$, the OUT 1 pulses are greater in number than the OUT 2 pulses, i.e., OUT 1 is going faster than OUT 2. With the OUT 1 pulses going faster than the OUT 2 pulses, there are going to be two OUT 1 pulses occurring in the interval between two successive OUT 2 pulses. This is the particular occurrence used to switch the frequency/phase detector from the phase detecting mode to the frequency detecting mode. When the second of the two OUT 1 pulses occurs, the circuit will operate to disable the divide by $M$ counter 34 and the traces in FIG. 8 illustrate this operation. The arrow 50 indicates the point in time at which the frequency phase detector switches from the phase detector mode to the frequency detector mode. In this illustration, the CLK 1 pulses have been drawn four-thirds as fast as the CLK 2 pulses. It is noted that the duty cycle of the SLIP 1 output is increasing and the duty cycle of the SLIP 2 output is decreasing proportionately. The second OUT 1 pulse occurs before the OUT 2 pulse at the position of the arrow 50.

When OUT 1 goes high at point 50, and since the SLIP 1 output is high because the strobe was STROBE 1, there are two highs on gate 46 and the output of gate 46 goes low to disable the divide by $M$counter 34. With ENABLE 1 low, the divide by $M$ counter prevents any CLK 1 pulses from entering and OUT 1 will not change state. The STROBE 1 pulses will continue but they perform no function at this time since SLIP 1 is high and remains high. Now, two extra CLK 1 pulses go by, and thereafter on the trailing edge of the next OUT 2 pulse, a STROBE 2 pulse occurs. This causes SLIP 1 to go low and SLIP 2 to go high, and at that time ENABLE 1 goes high, again allowing the CLK 1 pulses to enter the ÷ $M$ counter. The leading edge of the very next CLK 1 pulse forces SLIP 1 to go high again. On the trailing edge of this CLK 1 pulse, OUT 1 goes low and, at this point, the two counters 34 and 36 start off at the same point in counting again. Thus, in effect, the ÷ $M$ counter, since it has been going faster than the $N$ counter, is stopped for a period of time to allow the ÷N counter to catch up and thereafter the two counters are started off again to count. Subsequent operation of these two counters 34, 36 will result in the ÷$M$ counter being disabled for three counts out of each eight counts and this will continue for so long as the OUT 1 pulses are going faster than the OUT 2 pulses. In looking at the SLIP 1 trace it can be seen that it started out with a relatively low duty cycle and began working its way up to a higher duty cycle which, in effect, increases the DC value of the output from the integrator. The maximum duty cycle for SLIP 1 is about 90 or 95 percent and thus the high level SLIP 1 output is nearly a constant, and the frequency detector thus puts out a maximum DC level correction signal to slew the VTO to phase lock.

To return the frequency/phase detector to the phase detector mode, the OUT 1 and OUT 2 pulses must come to the same frequency and interleave with each other, and this occurs when the high level output drives the VTO rapidly in the frequency direction that produces OUT 1 equal OUT 2 or $f_1/M = f_2/N$. At this point the frequency/phase detector switches from the frequency detector mode to the phase detector mode.

For the third situation where $f_1/M$ is less than $f_2/N$ the circuit performs in an opposite fashion such that the duty cycle of SLIP 2 increases and the duty cycle of SLIP 1 decreases. The decreased duty cycle of SLIP 1 results in the minimum DC output level from the integrator which causes the frequency of the VTO to move in the opposite direction to bring the loop into lock.

The extra lines 52 and 54 to the NAND gates 40 and 48 in FIG. 7 take care of a situation where coincident pulses from OUT 1 and OUT 2 occur. It is possible to get two coincident output pulses when the system is seeking to lock up. This circuit allows only one of the pulses to pass through, and this decision is made by which of the SLIP 1 or SLIP 2 lines is high.

Figure 9:
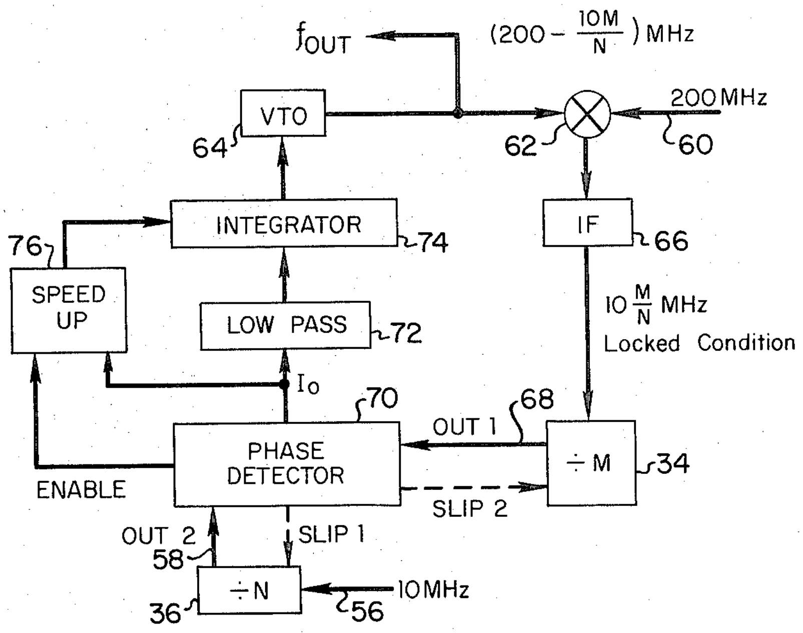
FIG. 9 is a block diagram illustrating the manner of incorporation of the phase detector circuitry of FIG. 7 in tne novel phase lock loop of the present invention.

Referring now to FIG. 9 there is shown a block diagram of a digital frequency/phase detector phase lock loop system according to the preferred embodiment of the present invention showing typical operating frequencies. In this specific example, there is a fixed 10 MHz CLK 2 reference 56 applied to the divide by $N$ counter 36 and a fixed 200 MHz signal 60 applied to a mixer 62 coupled to the output of a VTO 64. In this example N ranges between 11 and 22 ($11 \leq N \leq 22$) and $M$ ranges between 8 and 27 ($8 \leq M \leq 27$). The VTO signal and the 200 MHz signal are mixed to produce a signal from IF 66 which, in the locked condition, is 10M/N MHz. The VTO 64 is on the low side of 200 MHz. The output of the IF 66 is the CLK 1 signal to the divide by $M$ counter 68 and therefore, when the output of IF 66 is $10M/N$ MHz, the output of the divide by $M$ counter will be $10/N$ MHz. Since the output of the divide by $N$ counter 36 is also $10/N$, the frequency on OUT 1 will be equal to the frequency on OUT 2 and the frequency/phase detector will be operating in the phase detector mode. The output current $I_0$ from the phase detector 70 passes through a lowpass filter 72 to the loop compensation circuit 74 including the integrator for storing the charge to tune the VTO 64 to maintain the loop locked. In this locked condition, the output of the VTO is (200 — 10*M*/*N*) MHz. Also, with the OUT 1 from divide by *M* 68 equal to the OUT 2 from divide by *N* 58, the speedup circuit 76 is disabled and the phase lock loop is operating in a normal phase detector mode to maintain the VTO 64 locked to (200 − 10 *M*/*N*) MHz. If the VTO 64 is slightly lower in frequency than the frequency of 200 − 10 *M*/*N*, the VTO is tuned to increase its frequency and vice versa.

Assume that the loop is not locked and the frequency/phase detector is in the frequency detector mode, then the speedup circuit 76 is enabled to slew the VTO 64 towards the lock condition 250 times faster than it would slew without the speedup. This speedup circuit is enabled by a sense circuit that senses when the frequency/phase detector is in the frequency detector mode. It can be seen from FIG. 6 that, when the phase lock loop is locked, SLIP 1 is always low when OUT 1 goes high. From FIG. 8 it can be seen that, where $f_1/M$ is greater than $f_2/N$, the SLIP 1 is high at the same time OUT 1 is high. Therefore, by utilizing a D flip-flop (see flip-flop 168 of FIG. 13*a*) that senses SLIP 1 on the leading edge of OUT 1, an output signal will be obtained that tells if $f_1/M$ is greater than $f_2/N$. The SLIP 1 is connected to the D input of the flip-flop 168 and the OUT 1 is connected to the clock input of the flip-flop so that the $\bar{Q}$ output of the flip-flop will be a one (i.e., high) if the phase lock loop is locked or if the output of the ÷ *M* counter is too slow, while the $\bar{Q}$ will be a zero, (i.e., low) if the output of the ÷ *M* counter is too fast. In like manner, a flip-flop (see flip-flop 166 in FIG. 13*a*) counter in which SLIP 2 is connected to the D input and OUT 2 is connected to the clock input will give a 1 output on $\bar{Q}$ if the output of the ÷ *M* counter is too fast and a 0 output if the output of the ÷ *N* counter is too fast. By connecting these two $\bar{Q}$ bar outputs to an NAND gate 170 in FIG. 13*a* the output of the NAND gate will be 0 if the phase lock loop is locked and will be 1if the speedup circuit is to be enabled to produce a fast lock.

Figure 10:
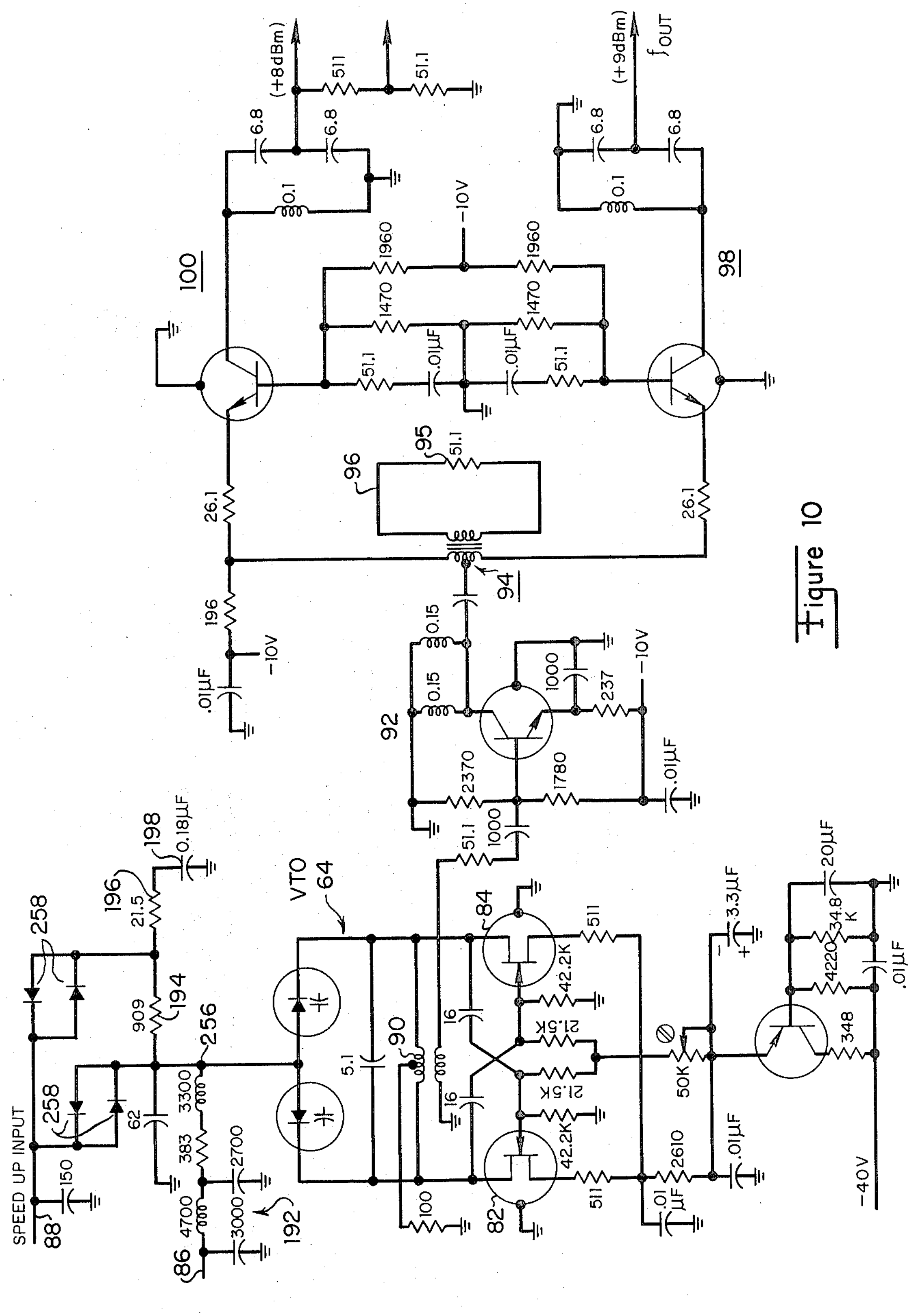
FIG. 10 is a schematic diagram of the voltage tunable oscillator assembly of the present invention.

Referring now to FIG. 10, there is shown the VTO assembly utilized in the preferred embodiment. This assembly includes a voltage tunable oscillator 64 comprising a pair of FETs 82, 84 with cross-coupled feedback much like in a bistable multivibrator. There are two inputs to the tuning circuitry of the VTO, one input 86 being the normal tuning input of the phase detector and the other input 88 being the speedup input from the speedup circuit. The operation of the tuning circuitry will be described below. There is very light loading on the output tank 90 so that it doesn't load down the oscillator which would degrade its noise performance. The lightly coupled output is transmitted to a standard form of buffer amplifier 92, the output of the buffer amplifier being transmitted to a power splitter 94 to split the signal into two branches. The current splitting at the input of the power splitter cancels the flux in the secondary 96 of the transformer and thus there is no current in the transformer secondary. If there is any coupling current back through one of the branches which tends to increase the current flowing in one direction through the power splitter, a flux is set up in the transformer secondary and the secondary current dissipates in a resistor 95. Thus this circuit serves to isolate or decouple the two branches. One branch of the output of the power splitter goes through a first power amplifier 98 of conventional design, the output of this power amplifier serving as the $f_{OUT}$ of the system. The second branch of the power splitter leads to a second power amplifier 100 leading to the mixer circuit 62 of this system.

Figure 11:
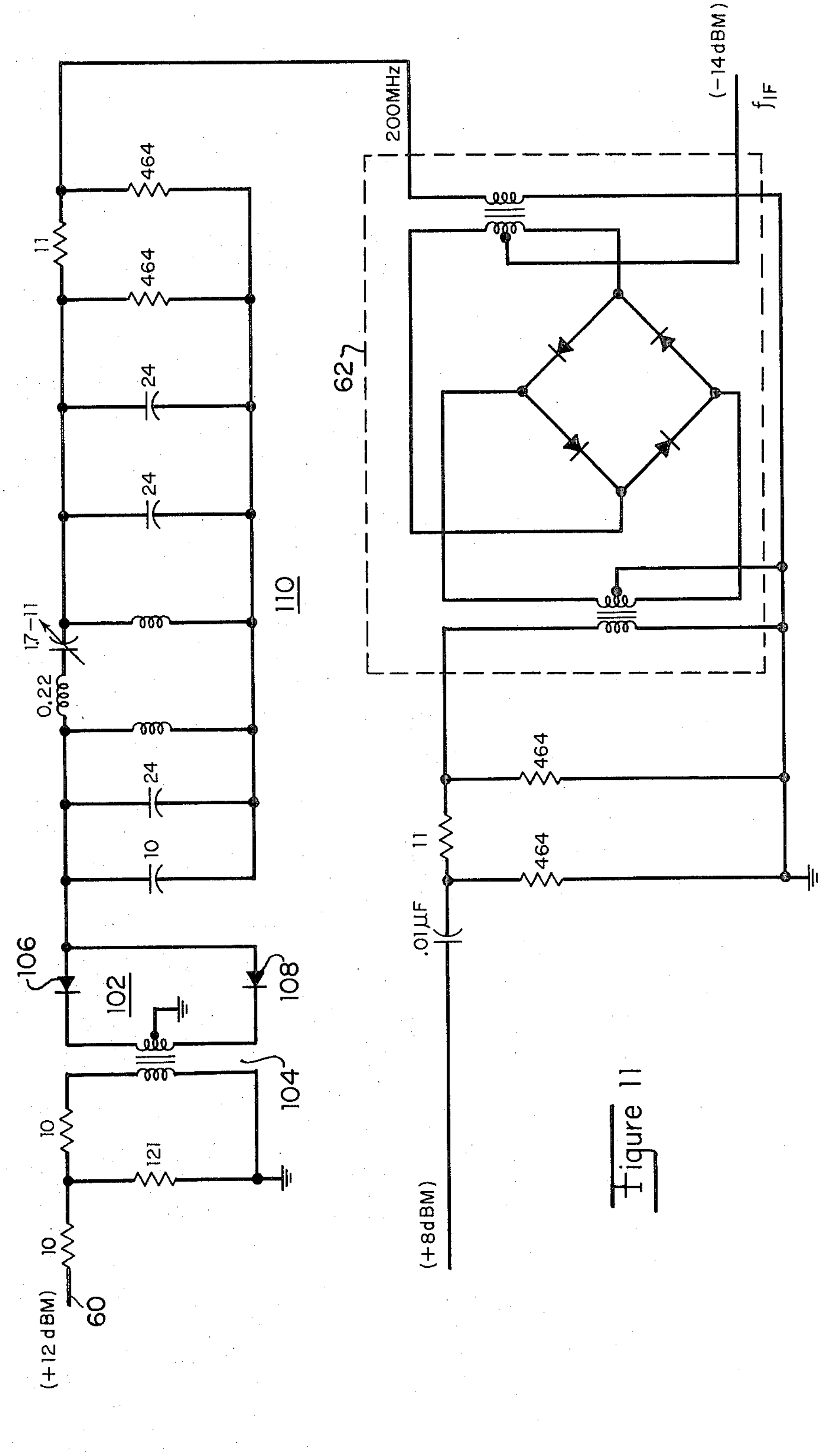
FIG. 11 is a schematic diagram of the converter circuit for producing the desired IF frequency in the system of FIG. 9.

Referring to FIG. 11, the 100 MHz reference signal 60 at a high level (+ 12 dBM) is delivered to a doubler circuit 102 comprising transformer 104 and diodes 106 and 108 where the signal is doubled in frequency by full wave rectification. The output of the doubler is transmitted through a bandpass filter 110 and the 200 MHz output signal is transmitted to a conventional form of mixer circuit 62. The other input to the mixer 62 is the output of the VTO 64 via power amplifier 100. In this illustration, this output of VTO 64 is a variable frequency signal defined by *M* and *N* which varies between 175–196 MHz. The $f_{IF} = 200 - f_{VCO}$ which, in the locked condition, is 10*M*/*N* MHz. With $8 \leq M \leq 27$ and $11 \leq N \leq 22$, the IF frequency varies between 4–25 MHz; actually, in operation, the lowest that the system goes is *M* of 8 and an *N* of 21 to give an $f_{IF}$ of about 4 MHz.

Figure 12A:
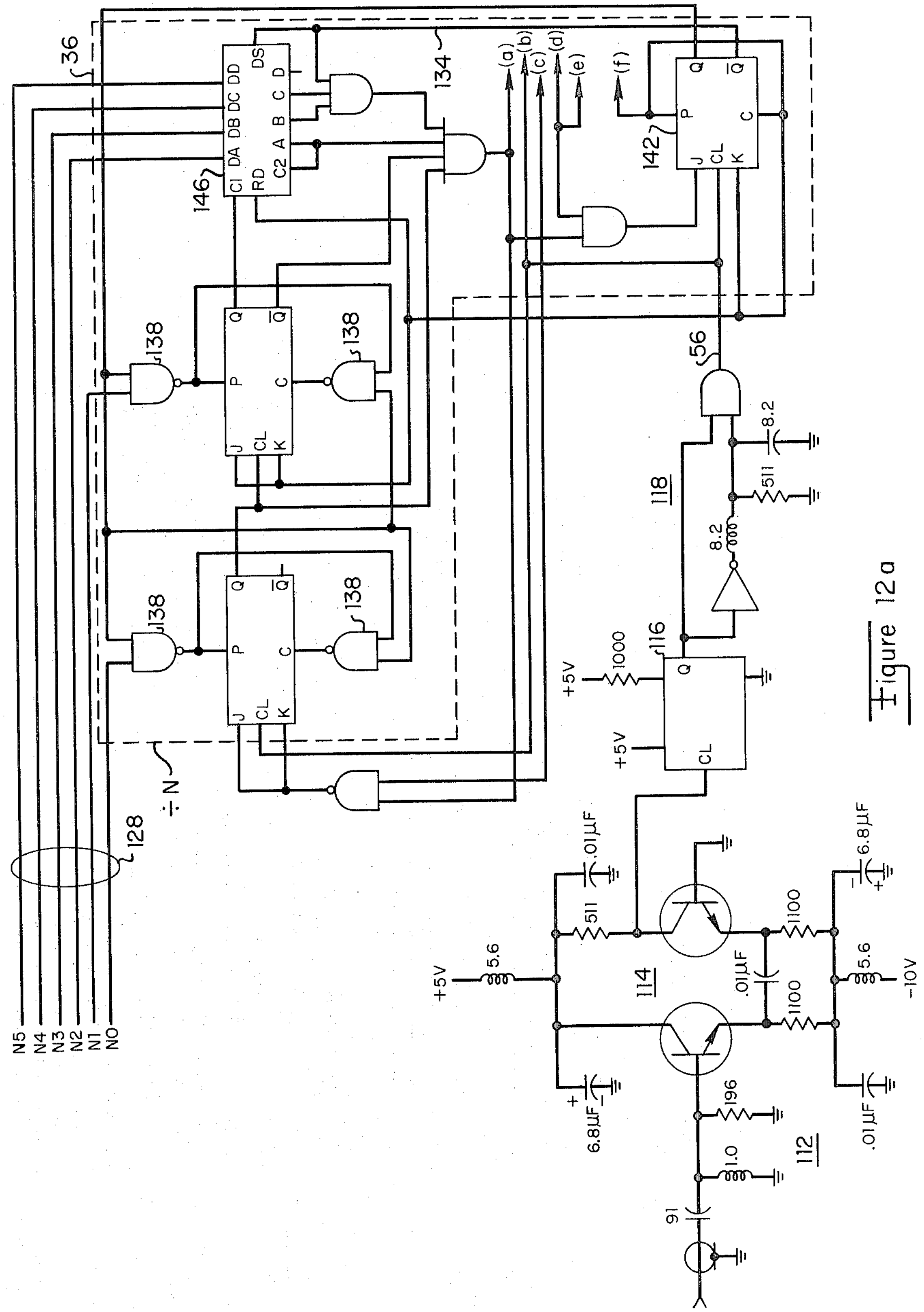
FIG. 12*a* and 12*b* are a schematic diagram of the phase detector and associated $\div N$ and $\div M$ counters.
Figure 12B:
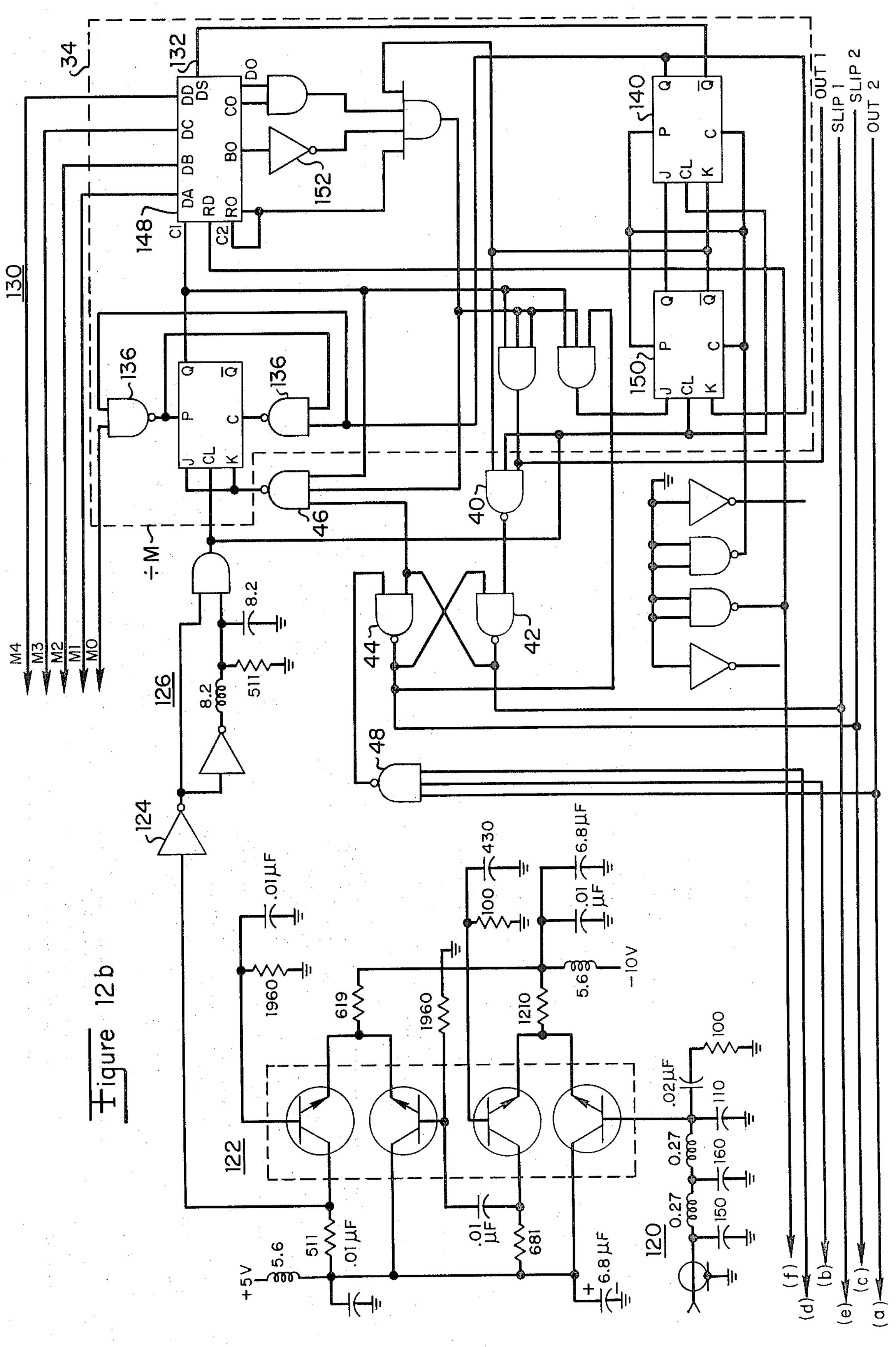

Referring now to FIG. 12*a*, and 12*b* the 10 MHz signal input 56 to the ÷ *N* counter 36 (of FIG. 9) is provided from a 20 MHz signal which passes through a matching network 112 to a differential amplifier 114 which also serves as a TTL converter. The output of the differential amplifier 114 is transmitted to a divide by two circuit 116 and its output is utilized to operate a one-shot circuit 118, the output of the one-shot being the desired 10 MHz input to the divide by *N* counter 36. This 10 MHz signal is the CLK 2 signal.

The $f_{IF}$ signal of 4–25 MHz is delivered through a lowpass filter 120 which serves to filter out any 200 MHz signal and pass the 4–25 MHz to a limiter circuit 122 of conventional design which also serves as a TTL converter. The output of the limiter 122 is transmitted through a buffer inverter gate 124 to a one-shot multivibrator 126, the output of which is the train of CLK 1 pulses. The ÷ *N* and ÷ *M* counter circuitry in this FIG. 12 is very similar to the counter circuitry shown in the FIG. 7 and the similar elements bear similar reference numerals. In this particular embodiment, the dividers are somewhat more complex but only in one respect. The divide ÷ *N* counter 36 has a couple of more bits added to the *N* inputs 128 and the divide by *M* counter 34 has one more bit input on the *M* inputs 130 as compared with the circuitry illustrated in FIG. 7. Although six bits are shown in the divide by *N* counter inputs, actually only five bits are utilized. The added bits allow an expansion of the divider circuits; for example, with the six bit input, *N* can be increased up to 64. Therefore, this added circuitry allows the parallel loading of extra data bits to the two "divide by" counters.

The data strobe lines 132 and 134 strobe the data in when there is a low on the line. The gates 136 and 138 have their data strobed in when their data strobes lines are high. The data strobe for the outboarded parallel loads, i.e. gates 136 and 138, come from the Q outputs of flip-flops 140 and 142 whereas the data strobe 132 and 134 respectively comes from the Q outputs of these two circuits. In addition to adding the additional bit capability, the outboarded load devices result in an increased speed of operation. The four stage parallel loaded flop-flop circuits 146 and 148 are not fast enough to go to 25 MHz and since the ÷ *M* counter has to work to 25 MHz, the outboard stage provides the necessary speed.

It is necessary to allow enough time to parallel load circuits 146 and 148 at 25 MHz; the time interval between pulses at 25 MHz, i.e., 40 nanoseconds, is insufficient. Therefore, circuit 142 in the ÷ *N* counter and circuits 140 and 150 in the ÷ *M* counter sense two or three counts before the terminal count, that is, the end of the sequence, and they start parallel loading 146 and 148 two or three counts prior to the terminal count. When the terminal count is completed, the normal counting up is allowed to start. In the ÷ *N* counter two counts are sensed before the terminal count while, in the ÷ *M* counter three counts are sensed since the ÷ *M* counter must go to 25 MHz while the ÷ *N* counter does not have to go high. Thus the ÷ *M* counter includes an additional inverter 152.

Figure 13A:
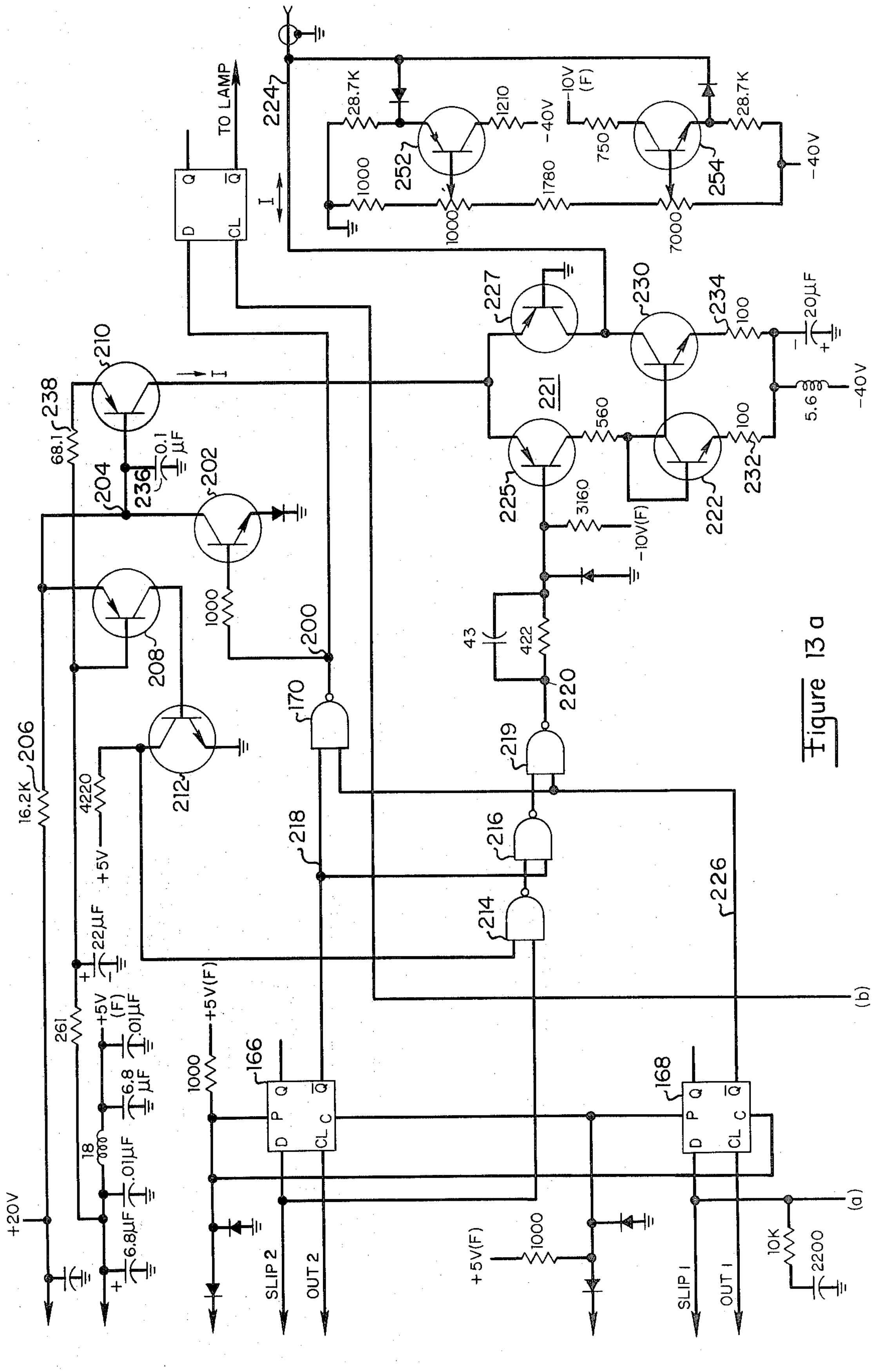
FIG. 13*a* and 13*b* are a schematic diagram of the speed up circuitry of the system of FIG. 9.
Figure 13B:
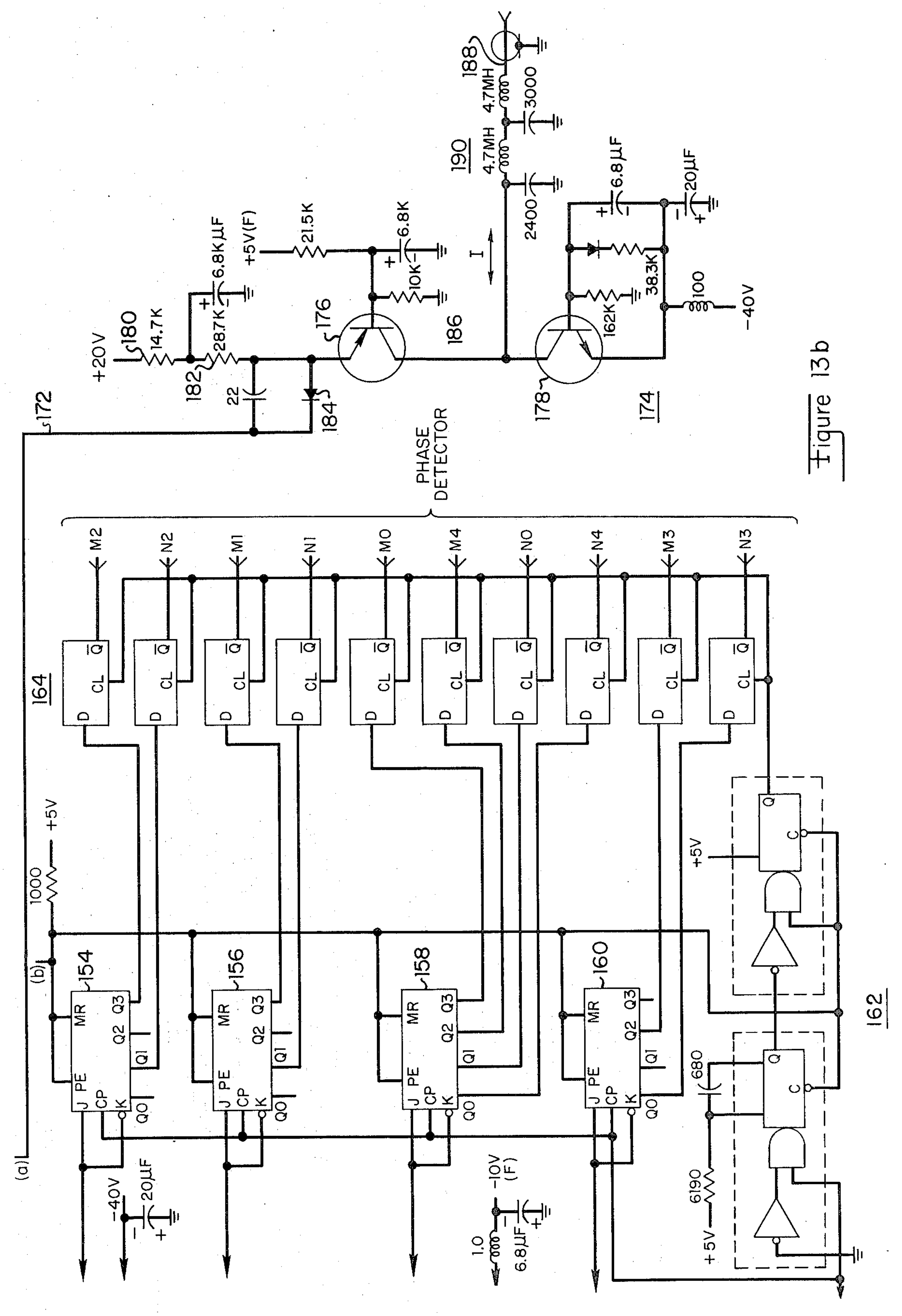

Referring now to FIG. 13*a* and 13*b* and *M* and *N* data is entered in four bit serial form and goes through four shift registers 154, 156, 158 and 160 and, when the information has been shifted in and the register settled down, the two one shot multivibrator circuits 162 operate to strobe the data into the ten latch circuits 164 so that the *M* and *N* data is presented simultaneously to the loop. This is a convenient form for presenting the *N* and *M* data although other presentation means could be employed.

As described above, the circuit for sensing whether or not the phase lock loop is locked comprises two flipflop circuits 166 and 168 and the NAND gate 170. The SLIP 1 and OUT 1 inputs are fed to the D and clock inputs, respectively, of flip-flop 166 while the SLIP 2 and OUT 2 inputs are transmitted to the D and clock inputs, respectively, of flip-flop 168. In addition to the lock information, this circuit also operates to produce the frequency sense signal to establish which way the VTO is to be tuned to reach the lock frequency.

The SLIP 1 signal which, as described above, is utilized for the phase detector operation when the detector is operating in the phase detector mode, is transmitted via line 172 to the TTL-to-current interface circuit 174 including the transistors 176 and 178, this latter circuitry operating to convert the SLIP 1 incoming signal to a current. In this circuit, transistor 178 is a current sink which produces a current, I, of about 0.2 milliamp while resistor circuit 180 and 182 produces a current 2I. If SLIP 1 is high, then diode 184 is off and transistor 176 is one and current 2I goes down to the node 186 and this 2I current goes out terminal 188. Since a current I is coming in terminal 188 and through transistor 178, the total net current is I going out of terminal 188.

If SLIP 1 is low, the current 2I from resistors 180, 182 is shunted through diode 184 and transistor 176 is off, resulting in a net current I in from junction 188. This current from the TTL interface passes through one-half of a lowpass filter 190 and then through the second half of the lowpass filter 192 in FIG. 10, and through resistors 194 and 196 and the integrating capacitor 198 to ground. The current pulses passing into the two filter circuits 190, 192 result in only a DC current component at the filter output which will continually charge the capacitor 198 to tune the VTO. In the steady state or locked condition, there is no net current going in or out and charging the capacitor 198, i.e., the charge going out in one-half cycle is equal to the charge going in the other half cycle and the net is zero, resulting in a 50 percent duty cycle on the SLIP 1 output.

When the phase lock loop is in lock, there is a low logic signal on node 200 in FIG. 13*a* from the output of gate 170 and the enable transistor 202 is off. Node 204 charges toward 20 volts through a 16.2K ohm resistor 206 with roughly a 1 milliamp current. The base of transistor 208 is at about 5 volts and node 204 is charged to about 5.6 volts, turning off transistor 210. Since transistor 210 is turned off the 1 milliamp of current passes through 208 and turns 212 on, and thus the input to gate 214 goes low, forcing the input to gate 216 high. Since, in lock, node 218 is high, the output of gate 216 is forced low, causing noze 220 at the output of gate 219 to go high. Therefore, when locked in steady state, the output of transistor 222 is high and, since there is no current out of current source 210, there is no current going in or out of terminal 224, the speed up output.

During the unlocked condition, assume that node 226 is low. (One of the two possibilities: either node 226 or node 218 is low but not both.) Then node 200 becomes high, turning on the enable transistor 202 which pulls down the base of 210, sending a current of about 50 ma through 210; this 50 ma current is large compared to the current at 188 in FIG. 13*b*.

This 50 ma current goes into the TTL interface 221 comprising transistors 222, 225, 227, and 230 which operates as follows. A low on mode 226 forces the output of gate 219 high and 225 is off and transistor 227 is on and the 50 ma of current from 210 goes through 227 and out terminal 224. This 50 ma current output on 224 continues until the phase detector circuit indicates the loop is in lock, at which time the current I gradually disappears as described below.

When the opposite is true, i.e., when node 218 is low and node 226 is high, node 200 is high and the 50 ma is flowing through 210. Node 218 being low results in both inputs to gate 219 being high and node 220 goes low, turning transistor 225 on and 227 off. The current I flows down through 225 and puts the same drop across the base to emitter of transistor 222 as the base to emitter junction of transistor 230 and that forces the same voltage drop across resistor 232 as across resistor 234, defining the current I through resistor 234 to be the same value as is flowing through transistor 210. Therefore, this current I is now flowing in on terminal 224 and down through transistor 230. This current is the same magnitude, i.e., 50 ma, as the current through transistor 210.

When locked, the enable line transistor 202 will turn off and capacitor 236 will gradually charge up and diminish the voltage drop across resistor 238 which decreases the 50 ma of current through 210 until finally this current diminishes to zero after about 500 microseconds.

When node 200 goes low on lock, a high exists on nodes 218 and 226; also transistor 212 is off. Now, SLIP 1 is used to feed the interface TTL circuit 174 while SLIP 2 feeds gate 214. Since the other input to gate 214 is high, the complement of SLIP 2 appears on the gate 214 output and since node 218 is high, there is a SLIP 2 signal on the output of gate 216. Also, since node 226 is high, the complement of SLIP 2 appears on the output of gate 219. Therefore, the complement of SLIP 2, i.e., SLIP 1, appears on node 220 when the system is in the locked condition and the circuit acts as a phase detector with the SLIP lines changing from high to low depending upon the phase between the two inputs. In other words, the system is starting down the linear portion of the frequency/phase detector characteristic of FIG. 3. Node 220 is now in phase with SLIP 1, i.e., they are essentially in phase except for the delay of three gates. Therefore, when a current is going out of terminal 188 to the normal input to the VTO, there is also a current going out of the speed up terminal 224 and these currents change directions in the same time intervals. If the current on 188 is going out for 15 percent of the time, the current on 224 is also going out for 15 percent of the time and the currents are coming in on both terminals 85 percent of the time. Thus, whereas in the unlocked condition terminal 224 has a 100 percent duty cycle with the current going either in or out in the frequency detector mode, in the phase detector mode both lines 188 and 224 have less than 100 percent duty cycle and are giving a phase detector response. Since the current in 224 is so much stronger than the current in 188 for most of the 500 microseconds between $t_1$ and $t_2$ in FIG. 4, the speed up circuit is controlling the tuning of the VTO until steady state at $t_2$.

Once line 224 is turned off when the current through transistor 210 goes to zero, node 204 continues to charge up to about 5.6 V turning on transistors 208 and 212. This forces node 220 high and this node no longer is the complement of SLIP 2. It takes about 50 microseconds to get node 220 completely high; maintaining this node high prevents any slight AC current from flowing in the terminal 224 as a result of node 220 changing as the complement of SLIP 1.

There are two clamps on the output of terminal 224. These clamps adjust the high and the low frequency limits of the VTO; these are the only two adjustments necessary for this novel phase lock loop system in contrast to other types of phase lock loop systems. The clamp including transistor 252 determines how low in frequency the VTO is allowed to go; in this embodiment the clamp prevents the VTO from going below 170 MHz, allowing the IF to go only to 30 MHz since the frequency detector in the illustrated embodiment does not operate above 35 megacycles, due to the frequency limit of the integrated circuits used. The other clamp including transistor 254 prevents the VTO from going any higher than 200 megacycles plus the lowest IF frequency of the system. In the present example this is 4 MHz insuring no operation above 204 MHz. This clamp is completely out of the picture at 196 MHz and completely clamped at 204 MHz. There are very loose restraints on these two clamps 252 and 254 and adjustment is not critical. For example, the lower clamp can be set anywhere from 168 MHz to 175 MHz.

The normal tuning on terminal 188 goes through the lowpass filter 192 (FIG. 10) and then through transistors 194 and 196 to the capacitor 198. When locked, there is no current input on lead 88 and it takes very small correction current inputs on lead 86 to maintain the VTO 64 tuned to the locked condition. When the speedup is in operation, there are large currents coming in through lead 88 and, if this current flowed through resistor 194, it would produce a very large voltage drop across this resistor. This large voltage drop reflected at node 256 would tune the VTO far off frequency and would make it unstable. The four diodes 258 are placed in the circuit to short out the resistor 194 such that, although all the current is still flowing to capacitor 194, node 256 does not reflect such a large voltage drop, but rather a small voltage drop is seen across resistor 196 plus the charge voltage on capacitor 198.

What is claimed is:

1. A phase lock loop for locking to a reference frequency derived from a reference signal, the phase lock loop comprising:

a variable frequency signal source having a tuning input and a signal output, the frequency of the output signal being controlled by a signal on the tuning input;

a frequency/phase detector having a first input connected to receive the signal source output signal and a second input connected to receive the reference signal, having a signal output for giving a signal indicative of the phase between the reference frequency and the signal source output frequency when those two frequencies are equal and for giving a signal indicative of the algebraic sign of the difference between the reference frequency and the signal source output frequency when these two frequencies are not equal, and having an enable output for giving a signal that indicates when the reference frequency and the signal source output frequency are not equal; and control means connected to the signal source tuning input, the frequency/phase detector signal output and the enable output for providing a signal path between the frequency/phase detector signal output and the signal source tuning input having a first gain and bandwidth when the reference frequency and the signal source output frequency are equal and a second gain and bandwidth when those two frequencies are not equal.

2. A phase lock loop as in claim 1 wherein the second gain and bandwidth are greater than the first gain and bandwidth.

3. A phase lock loop as in claim 2 wherein the gain and bandwidth of the signal path decrease gradually from the second to the first values after the signal source output frequency becomes equal to the reference frequency as the phase lock loop becomes locked.

4. A phase lock loop as in claim 3 wherein the control means comprises:

a first and a second filter network connected in series between the frequency/phase detector signal output and the signal source tuning input; and a variable gain amplifier connected in parallel with the first filter network and having an enable input connected to the frequency/phase detector enable output, the gain of the amplifier being responsive to the signal at the enable output.

5. A phase lock loop as in claim 4 wherein the reference frequency is a rational fraction of the frequency of the reference signal and the frequency/phase detector includes:

a divide by $N$ counter connected to receive the reference signal for dividing the frequency of the reference signal by an integer $N$;

a divide by $M$ counter connected to receive the signal source output for driving the frequency of the signal source output by an integer $M$; and circuit means connected to the divide by $N$ and divide by $M$ counters and to the frequency/phase detector signal and enable outputs for comparing and giving output signals indicative of the frequency and phase of the output signals from the divide by $N$ and divide by $M$ counters.

6. A phase lock loop as in claim 5 wherein the signal source includes:

a signal controlled oscillator having a tuning input and a signal output; and a frequency converter having inputs connected to receive the oscillator output signal and an intermediate frequency signal and having an output connected to the signal source signal output.

7. A phase lock loop as in claim 6 wherein the control means includes an energy storage device connected to the signal source tuning input for providing a voltage tuning signal for the signal tuned oscillator; and the circuit means provides a constant current to the energy storage device via the variable gain amplifier when the signal source output frequency differs from the reference frequency.

* * * * *

UNITED STATES PATENT OFFICE
CERTIFICATE OF CORRECTION

Patent No. 3,795,870 Dated March 5, 1974

Inventor(s) Steven Neil Sanders

It is certified that error appears in the above-identified patent and that said Letters Patent are hereby corrected as shown below:

In the Abstract, line 1, cancel "frequency-phase" and substitute -- frequency/phase --.

Column 2, line 17, cancel "mot" and substitute -- most --.

Column 2, line 46, cancel "frequency phase" and substitute -- frequency/phase --.

Column 11, line 23, cancel "and" (second occurrence) and substitute -- the --.

Column 12, line 18, cancel "noze" and substitute -- node --.

Column 12, line 33, cancel "mode" and substitute -- node --.

Column 15, line 2, cancel "driving" and substitute -- dividing --.

Signed and sealed this 16th day of July 1974.

(SEAL)
Attest:

McCOY M. GIBSON, JR.
Attesting Officer

C. MARSHALL DANN
Commissioner of Patents

FORM PO-1050 (10-69)
)-160010

USCOMM-DC 60376-P69
★ U.S. GOVERNMENT PRINTING OFFICE : 1969 O—366-334